(12) United States Patent
Fujiwara

(10) Patent No.: US 11,965,246 B2
(45) Date of Patent: Apr. 23, 2024

(54) DEPOSITION METHOD AND DEPOSITION APPARATUS

(71) Applicant: Tokyo Electron Limited, Tokyo (JP)

(72) Inventor: Naonori Fujiwara, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 515 days.

(21) Appl. No.: 16/435,749

(22) Filed: Jun. 10, 2019

(65) Prior Publication Data

US 2019/0390346 A1 Dec. 26, 2019

(30) Foreign Application Priority Data

Jun. 22, 2018 (JP) .................................. 2018-119119

(51) Int. Cl.
| | | |
|---|---|---|
| *C23C 16/52* | (2006.01) | |
| *C23C 16/24* | (2006.01) | |
| *C23C 16/40* | (2006.01) | |
| *C23C 16/458* | (2006.01) | |

(52) U.S. Cl.
CPC .............. *C23C 16/52* (2013.01); *C23C 16/24* (2013.01); *C23C 16/402* (2013.01); *C23C 16/4584* (2013.01)

(58) Field of Classification Search
None
See application file for complete search history.

(56) References Cited

U.S. PATENT DOCUMENTS

| | | | |
|---|---|---|---|
| 2007/0212850 A1* | 9/2007 | Ingle ................. | H01L 21/31612 257/E21.546 |
| 2011/0074013 A1* | 3/2011 | Ueda .................... | C23C 16/402 423/325 |
| 2013/0291798 A1* | 11/2013 | Lee ...................... | C23C 16/4584 901/43 |
| 2015/0184293 A1* | 7/2015 | Kato ................. | H01L 21/02219 118/725 |
| 2017/0053811 A1* | 2/2017 | Fung ................... | H01J 37/3244 |

FOREIGN PATENT DOCUMENTS

| | | |
|---|---|---|
| JP | H06-232116 | 8/1994 |
| JP | 2010-140997 | 6/2010 |
| JP | 2011-071414 | 4/2011 |
| JP | 2014-017296 | 1/2014 |
| JP | 2017-092098 | 5/2017 |
| JP | 2017-208534 | 11/2017 |

* cited by examiner

*Primary Examiner* — Joseph A Miller, Jr.
(74) *Attorney, Agent, or Firm* — IPUSA, PLLC

(57) ABSTRACT

A method of depositing a film over a substrate covered with at least an insulating film provided with a groove is provided. In the method, a deposition process for depositing the film is performed by supplying at least a raw material gas to the substrate. The raw material gas is supplied while changing an amount of the raw material gas supplied per unit time.

6 Claims, 15 Drawing Sheets

DEPOSITION METHOD AND DEPOSITION APPARATUS

CROSS-REFERENCE TO RELATED APPLICATIONS

This patent application is based upon and claims priority to Japanese Patent Application No. 2018-119119 filed on Jun. 22, 2018, the entire contents of which are incorporated herein by reference.

TECHNICAL FIELD

The present disclosure relates to a deposition method and a deposition apparatus.

BACKGROUND

Patent Document 1 discloses a method of forming a silicon oxide film on a recess that is formed on a substrate.

CITATION LIST

Patent Document

[Patent Document 1] Japanese Laid-open Patent Application Publication No. 2014-17296

SUMMARY

According to an aspect of the present disclosure, a method of depositing a film over a substrate covered with at least an insulating film provided with a groove is provided. In the method, a deposition process for depositing the film is performed by supplying at least a raw material gas to the substrate. The raw material gas is supplied while changing an amount of the raw material gas supplied per unit time.

DETAILED DESCRIPTION OF EMBODIMENTS

The present disclosure provides a deposition method and a deposition apparatus that is advantageous for desirably adjusting a thickness of a film to be formed on a wall surface of a groove on a substrate having at least an insulating film.

Hereinafter, a deposition method and a deposition apparatus according to an embodiment of the present disclosure will be described with reference to the accompanying drawings. In the present specification and drawings, elements having substantially identical features are given the same reference symbols and overlapping descriptions may be omitted.

[Deposition Apparatus According to an Embodiment]

Figure 1:
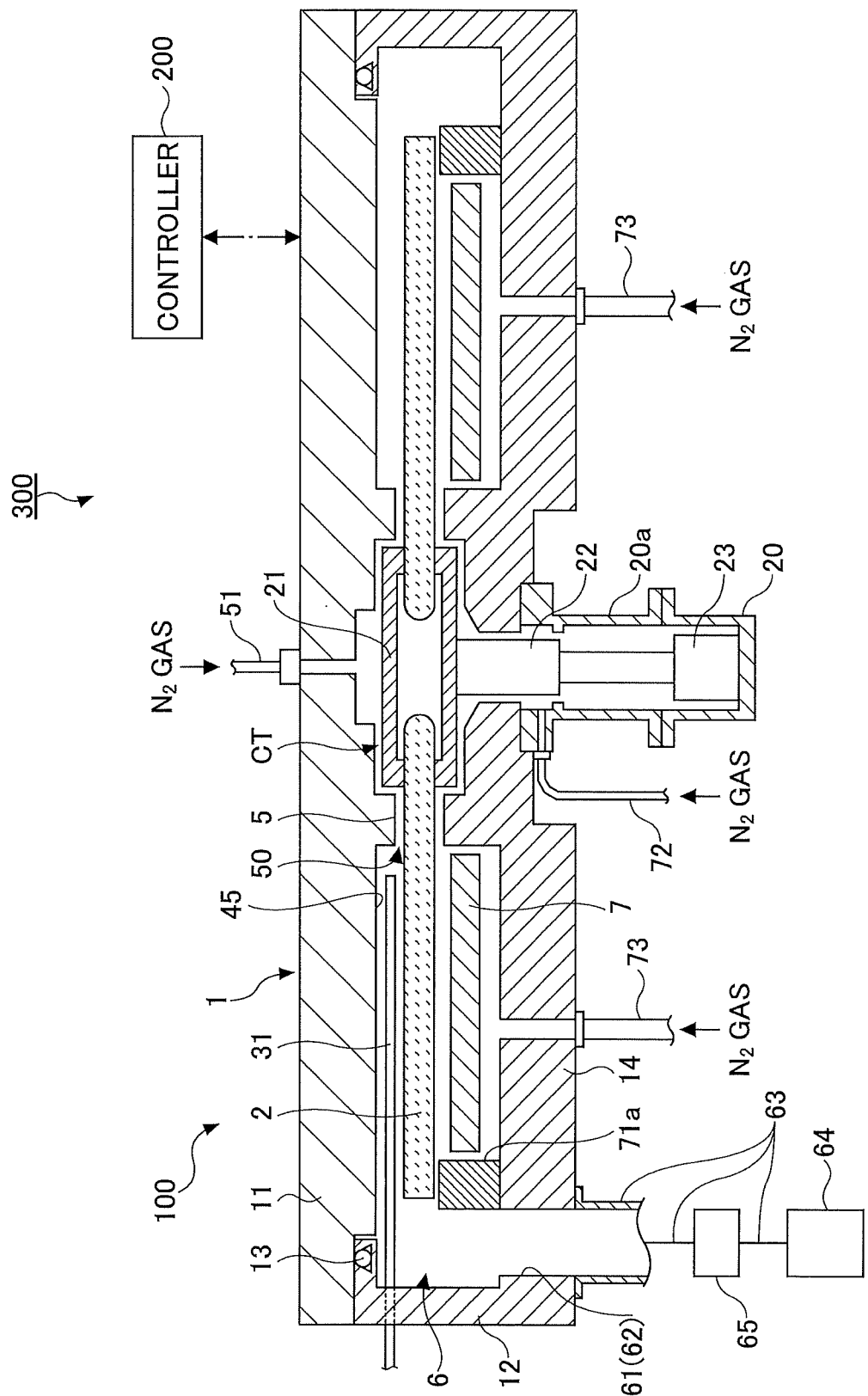
FIG. 1 is a longitudinal sectional view of a deposition apparatus according to an embodiment.
Figure 2:
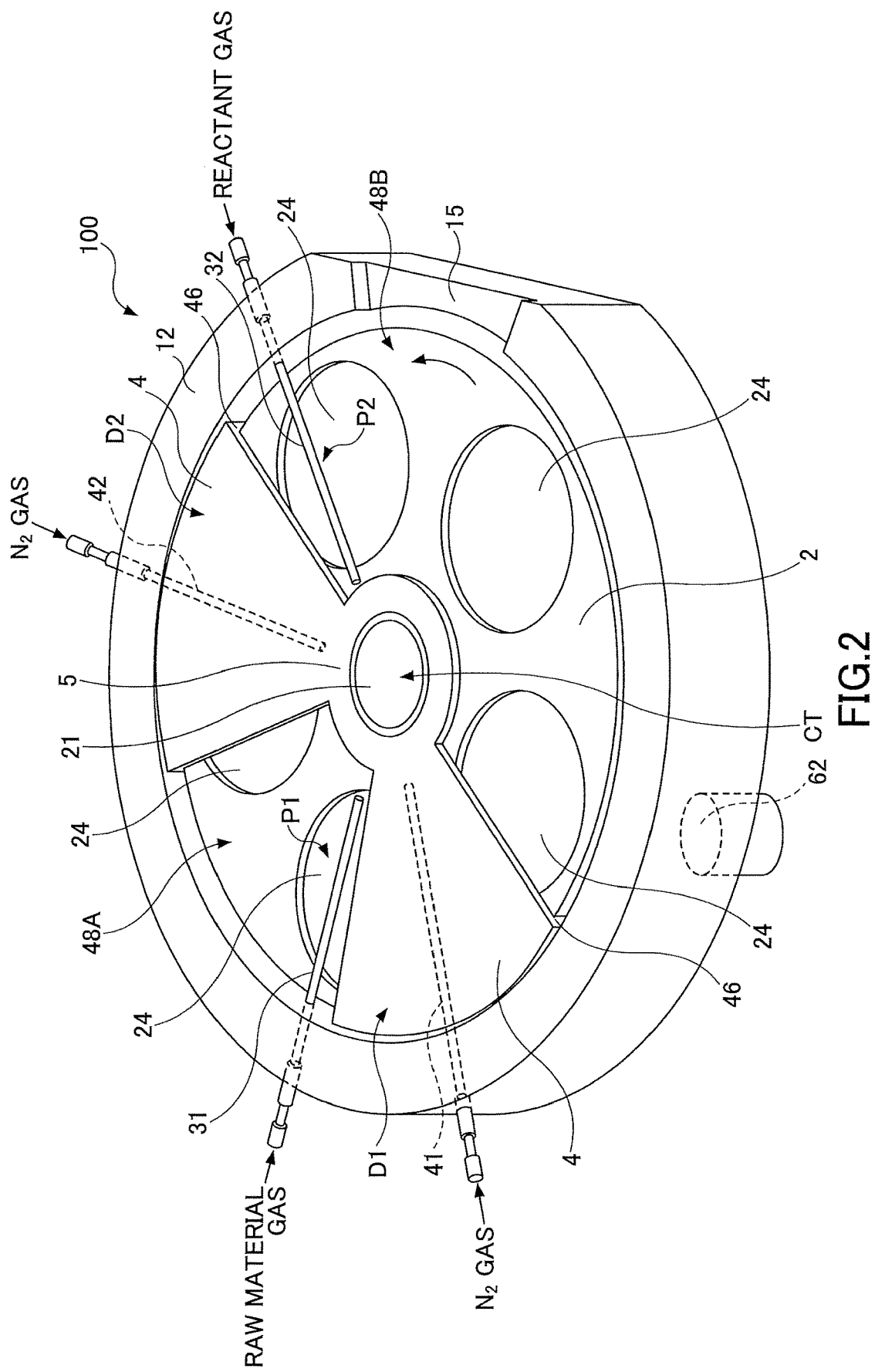
FIG. 2 is a perspective view illustrating a schematic configuration of an interior of the deposition apparatus of FIG. 1.
Figure 3:
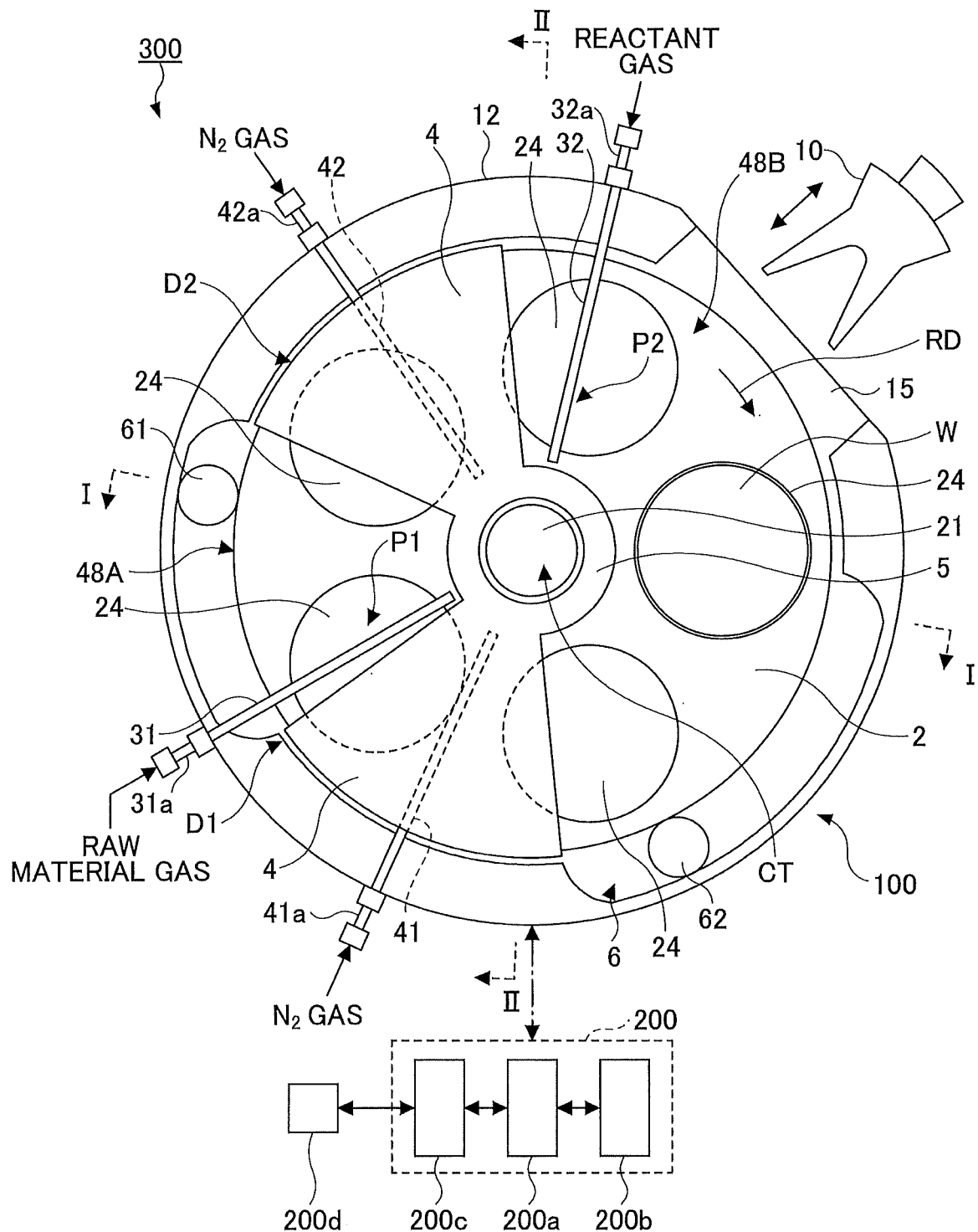
FIG. 3 is a plan view illustrating a schematic configuration of the interior of the deposition apparatus of FIG. 1, and is a diagram illustrating an internal configuration of a controller.
Figure 4A:
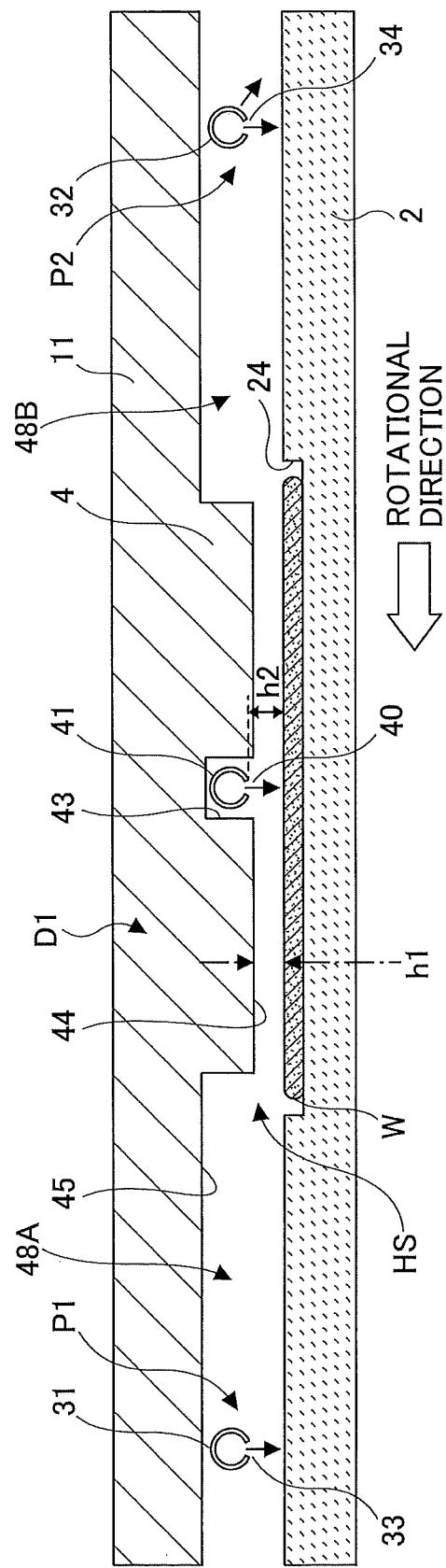
FIG. 4A is a longitudinal sectional view illustrating an example of a supply region and a separation region in the deposition apparatus of FIG. 1, taken along a line passing through a mounting portion on which a wafer is placed.
Figure 4B:
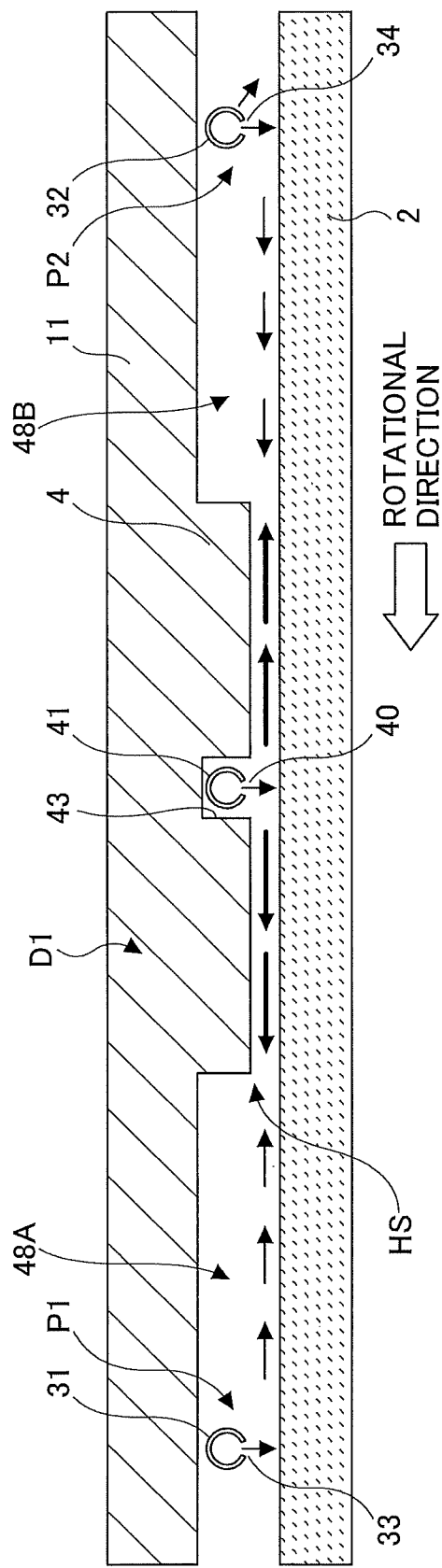
FIG. 4B is a longitudinal sectional view illustrating an example of the supply region and the separation region in the deposition apparatus of FIG. 1, taken along a line not passing through the mounting portion.
Figure 5:
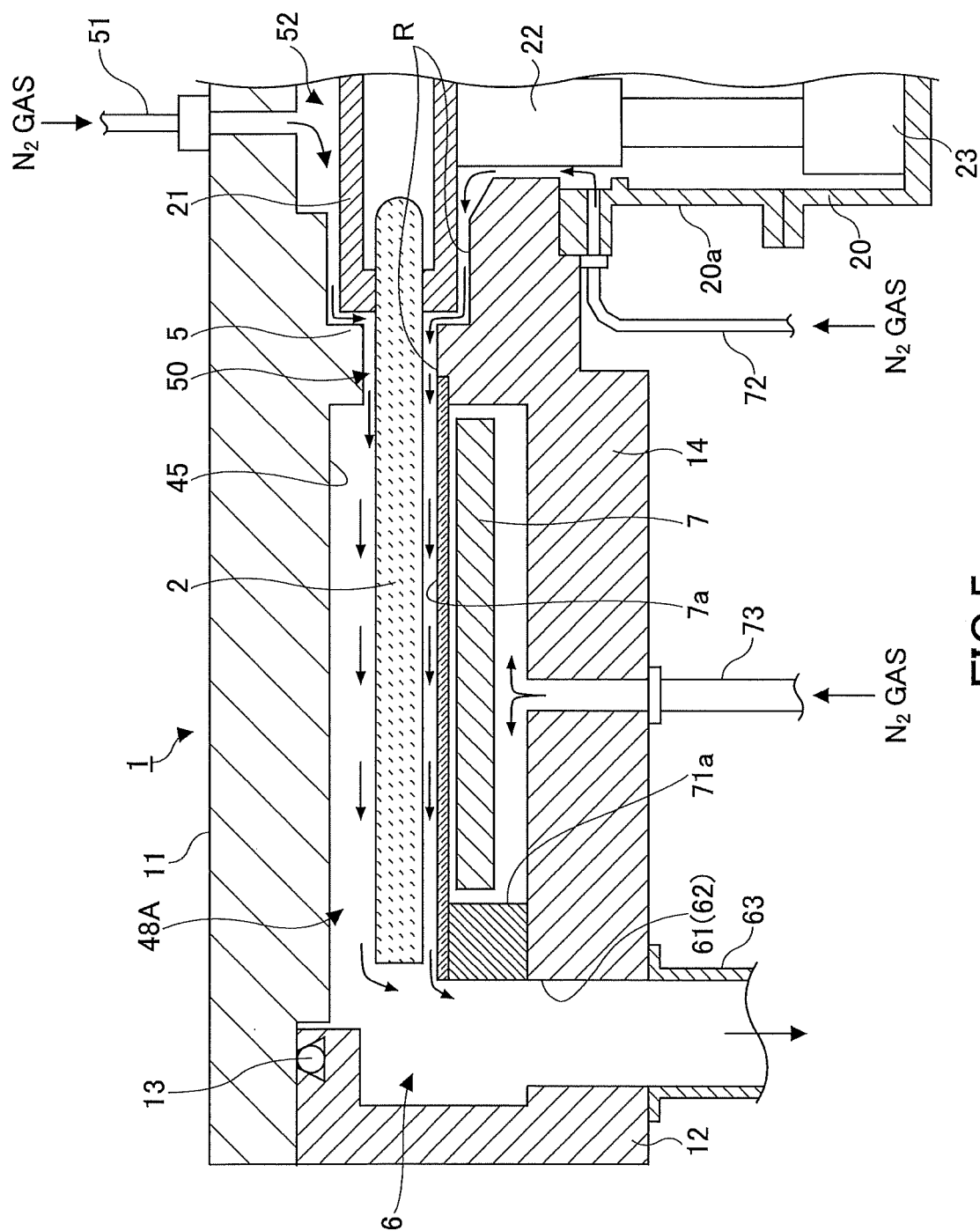
FIG. 5 is another longitudinal sectional view of the deposition apparatus of FIG. 1.
Figure 6:
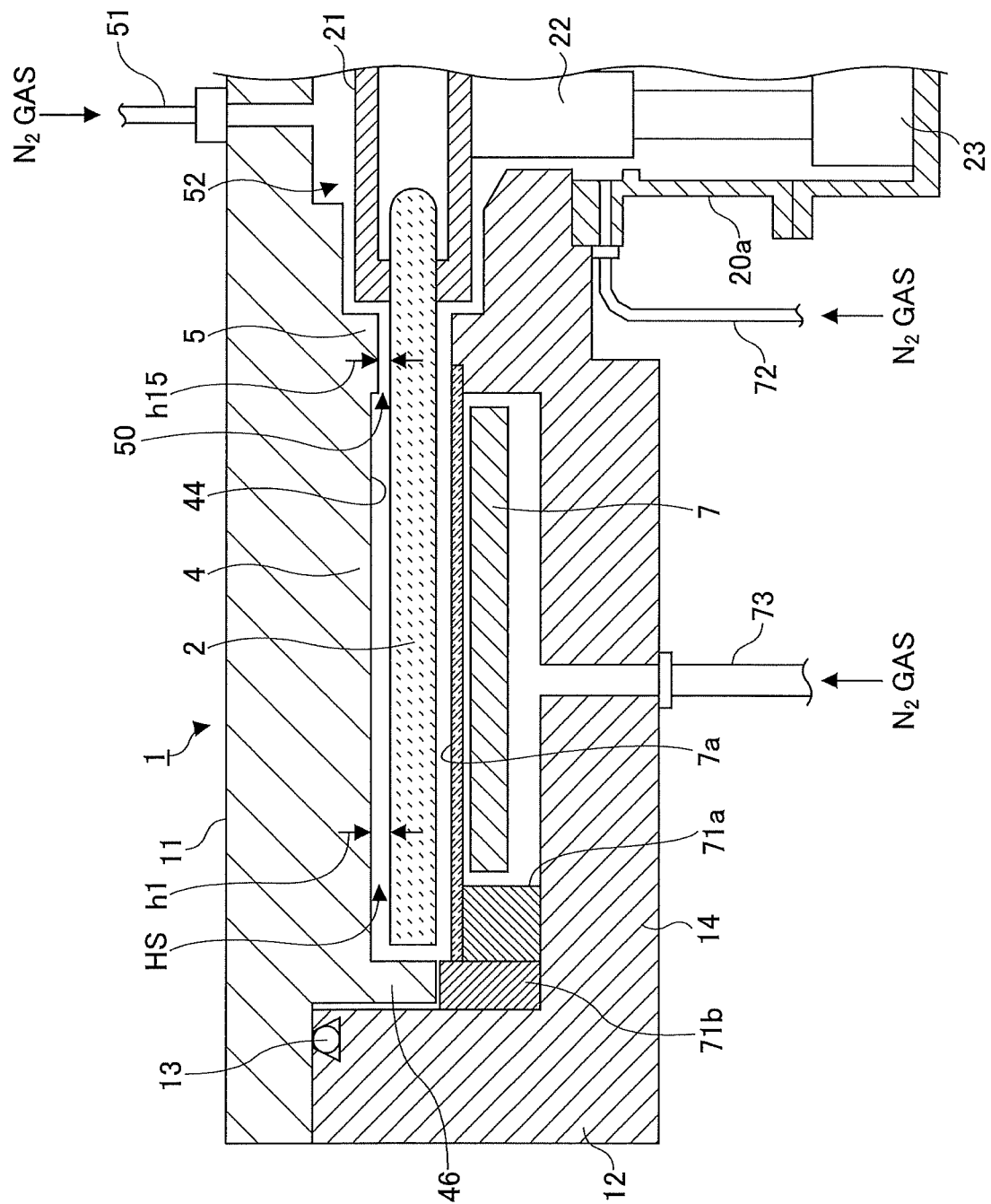
FIG. 6 is yet another longitudinal sectional view of the deposition apparatus of FIG. 1.

First, an example of the deposition apparatus according to the embodiment that is applied to a deposition method according to each embodiment of the present disclosure will be described with reference to FIGS. 1 to 6. Here, FIG. 1 is a longitudinal sectional view of the deposition apparatus according to the embodiment, and FIG. 2 is a perspective view illustrating a schematic configuration of an interior of the deposition apparatus of FIG. 1. FIG. 3 is a plan view illustrating the schematic configuration of the interior of the deposition apparatus of FIG. 1, and also includes a diagram illustrating the internal configuration of a controller. FIGS. 4A and 4B are longitudinal cross-sectional views each illustrating an example of a supply region and a separation region in the deposition apparatus of FIG. 1, and FIGS. 5 and 6 are other longitudinal sectional views of the deposition apparatus.

As illustrated in FIG. 1 (which is a cross-sectional view of FIG. 3 taken along line I-I) and FIG. 2, the deposition apparatus 300 includes a processing vessel 100 and a controller 200. The processing vessel 100 includes a processing chamber 1 that is circular (or substantially circular) in a planar view and is flat, and a rotary table 2 that has a rotational center at a center of the processing chamber 1. The controller 200 controls an entire operation of the deposition apparatus 300. The processing chamber 1 is configured to accommodate a wafer W, which is a substrate, in an interior of the processing chamber 1, and is used for applying a deposition process on a surface of the wafer W. The processing chamber 1 includes a vessel body 12 and a ceiling plate 11 that is detachable from the vessel body 12. The ceiling plate 11 is attached to the vessel body 12 via a sealing member 13 such as an O-ring, and the processing chamber 1 is hermetically sealed by the sealing member 13. The ceiling plate 11 and the vessel body 12 may be made from aluminum (Al), for example. Also, the rotary table 2 may be made from quartz, for example.

As illustrated in FIG. 1, the rotary table 2 is of a disc shape, and has a circular opening in the center. The rotary table 2 is held by a cylindrical core part 21 in a manner in which a periphery of the opening is sandwiched between the core part 21 from upper and lower sides. The core part 21 is fixed to an upper end of a rotating shaft 22 extending vertically. The rotating shaft 22 passes through a bottom 14 of the vessel body 12, and a lower end of the rotating shaft 22 is attached to an actuating unit 23 that rotates the rotating shaft 22 around a vertical axis. By actuating the actuating unit 23, the rotary table 2 can rotate around its central axis as a rotating center. The rotating shaft 22 and the actuating unit 23 are housed in a cylindrical casing 20 having an opening on its upper surface. The casing 20 is hermetically attached to a lower surface of the bottom 14 of the processing chamber 1 through a flange portion provided on the upper surface of the casing 20, and the internal atmosphere of the casing 20 is isolated from the external atmosphere.

As illustrated in FIGS. 2 and 3, on an upper surface of the rotary table 2, the mounting portions 24, which are circular in a planar view shape and are depressed downward, are formed at regular angular intervals. A wafer W is housed and mounted in each of the mounting portions 24. However, FIG. 3 illustrates a state in which the wafer W is mounted on one mounting portion 24.

A longitudinal sectional view in FIG. 4A illustrates a cross section of the rotary table 2 passing through the mounting portion 24 on which a wafer W is disposed, and FIG. 4B is a cross section not passing through the mounting portion 24 of a rotary table 2. As illustrated, the mounting portion 24 has a diameter slightly larger (e.g., 4 mm larger) than a diameter of the wafer W. Furthermore, a depth of the mounting portion 24 is approximately equal to a thickness of the wafer W. Because the depth of the mounting portion 24 and the thickness of the wafer W are approximately equal, when the wafer W is disposed on the mounting portion 24, a surface of the wafer W and a surface of an area of the rotary table 2 other than the mounting portion 24 become approximately the same level. If there is a relatively large step between the wafer W and the area of the rotary table 2 other than the mounting portion 24, this step may cause turbulence in the gas flow and may affect film thickness uniformity on the wafer W. To reduce such effect, the surface of the wafer W and the area of the rotary table 2 other than the mounting portion 24 are made to be approximately the same height. Here, the term "approximately the same height" means, for example, a difference in height of approximately 5 mm or less, but it is preferable that the difference in height is as close as possible to zero within a range allowable for processing accuracy.

As illustrated in FIGS. 2 to 4B, two projections 4 are provided spaced apart from each other along a rotational direction of the rotary table 2 (e.g., arrow RD in FIG. 3). In FIGS. 2 and 3, illustration of the ceiling plate 11 is omitted in order to facilitate a description of the interior of the processing chamber 1. As illustrated in FIG. 4A or 4B, the projection 4 is provided on a lower surface of the ceiling plate 11. As can be seen from FIG. 3, the projection 4 is planar, and has a substantially fan-like shape. An apex portion of the substantially fan-like shaped projection 4 is approximately centered in the processing chamber 1, and an arc portion of the substantially fan-like shaped projection 4 is located along the inner circumferential wall of the vessel body 12. Further, as illustrated in FIG. 4A, the projection 4 is disposed such that a bottom surface 44 (may also be referred to as a ceiling surface 44) of the projection 4 is positioned at height h1 from the rotary table 2 or a wafer W disposed on the mounting portion 24.

Also, as illustrated in FIGS. 3, 4A, and 4B, the projection 4 has a groove portion 43 that extends radially so as to divide the projection 4 into two portions. In the groove portion 43, a separation gas nozzle 41 (42) is stored. In the present embodiment, the groove portion 43 is formed so as to divide the projection 4 evenly, but the groove portion 43 may be formed such that an upstream side portion of the projection 4 (in the rotational direction of the rotary table 2) becomes wider, for example. As illustrated in FIG. 3, the separation gas nozzle 41 (42) is introduced from a peripheral wall portion of the vessel body 12 into the processing chamber 1, and is supported by attaching a gas inlet port 41a (42a), which is an extreme end of the separation gas nozzle 41 (42) with respect to the center of the processing chamber 1, to an outer peripheral wall of the vessel body 12.

The separation gas nozzle 41 (42) is connected to a gas supply source (not illustrated) of separation gas. As the separation gas, an inert gas such as nitrogen ($N_2$) gas can be applied, but types of gas to be applied as the separation gas are not particularly limited as long as the gas does not affect deposition of a film. In the present embodiment, $N_2$ gas is applied as the separation gas, but this $N_2$ gas also serves as a gas (pushing gas) for pushing in the raw material gas in addition to serving as the separation gas. The separation gas nozzle 41 (42) is provided with discharge holes 40 (FIG. 4A or 4B) for discharging $N_2$ gas toward the surface of the rotary table 2. The discharge holes 40 are provided at predetermined intervals in a longitudinal direction. In the present embodiment, each of the discharge holes 40 has a diameter of approximately 0.5 mm, and the discharge holes 40 are arranged at an interval of approximately 10 mm mutually, along the longitudinal direction of the separation gas nozzle 41 (42).

According to the above-described configuration, by the separation gas nozzle 41 and the projection 4 corresponding to the separation gas nozzle 41, a separation region D1 that defines a separation space HS is provided. Similarly, the separation gas nozzle 42 and the corresponding projection provide a separation region D2 defining another separation space HS. Further, a first region 48A (the first supply region) is formed on a downstream side with respect to the separation region D1, in the rotational direction of the rotary table 2, which is substantially surrounded by the separation regions D1 and D2, the rotary table 2, a bottom surface 45 of the ceiling plate 11 (hereinafter, the bottom surface 45 of the ceiling plate 11 may be referred to as the "ceiling surface 45"), and an inner peripheral wall of the vessel body 12. Further, a second region 48B (a second supply region) is formed on the upstream side with respect to the separation region D1, in the rotation direction of the rotary table 2, which is substantially surrounded by the separation regions D1 and D2, the rotary table 2, the ceiling surface 45, and the inner peripheral wall of the vessel body 12. When $N_2$ gas is discharged from the separation gas nozzles 41 and 42 in the separation regions D1 and D2, pressure in the separation space HS becomes relatively high, and the $N_2$ gas flows from the separation space HS toward the first region 48A and the second region 48B. That is, the $N_2$ gas supplied from the separation gas nozzles 41 and 42 is guided to the first region 48A and the second region 48B by the projection 4 in the separation regions D1 and D2.

Also, as illustrated in FIGS. 2 and 3, in the first region 48A, a raw material gas nozzle 31 is introduced radially from the peripheral wall portion of the vessel body 12 to the rotary table 2. Further, in the second region 48B, a reactant gas nozzle 32 is introduced which supplies an oxidant gas such as water vapor ($H_2O$) radially from the peripheral wall portion of the vessel body 12. The raw material gas nozzle 31 and the reactant gas nozzle 32 are respectively supported by attaching the gas inlet ports 31a and 32a, which are extreme ends with respect to the center of the processing chamber 1, to the outer peripheral wall of the vessel body 12, as well as the separation gas nozzles 41 and 42. Besides water vapor, the applied oxidant gas may be oxygen, ozone, or the like. Further, the deposition apparatus 300 according to the present embodiment can be applied to forming, as a protective film for example, a silicon-containing film such as a silicon oxide film ($SiO_2$ film) or a silicon nitride film (SiN film), in addition to forming an aluminum oxide film (AlO film).

The raw material gas nozzle 31 and the reactant gas nozzle 32 have multiple discharge holes 33 and multiple discharge holes 34 respectively, for discharging the raw material gas and the reactant gas toward the upper surface of the rotary table 2 (a surface having the mounting portion 24 on which a wafer W is mounted) (see FIG. 4A or 4B). In the present embodiment, each of the discharge holes 33 and 34 have a diameter of approximately 0.5 mm, and the discharge holes 33 and the discharge holes 34 are disposed at an interval of approximately 10 mm along the longitudinal direction of the raw material gas nozzle 31 and the reactant gas nozzle 32 respectively.

The raw material gas nozzle 31 is connected to a raw material gas supply source (not illustrated) to form a raw material gas supply unit (gas supply part), and the reactant gas nozzle 32 is connected to a reactant gas supply source (not illustrated) to form a reactant gas supply unit (gas supply part). Various types of gas can be used as the raw material gas, and a trimethylaluminum (TMA) gas, which is a type of organometallic gas containing Al, can be used. Alternatively, an aminosilane gas such as DIPAS (diisopropylaminosilane) gas, 3DMAS (trisdimethylaminosilane) gas, BTBAS (bis(tertiary-butylamino)silane) gas, which is a silicon-containing gas, may be applied. Hereinafter, a case of applying TMA gas will be described. Also, in the following description, with respect to a region below the raw material gas nozzle 31, a region in which the TMA gas is caused to be adsorbed to a wafer W may be referred to as a processing region P1. Also, with respect to a region below the reactant gas nozzle 32, a region in which the TMA gas adsorbed to the wafer W is caused to be reacted (oxidized) with $H_2O$ gas may be referred to as a processing region P2.

As illustrated in FIGS. 4A and 4B, the separation region D1 has a flat, low ceiling surface 44 (as well as in the separation region D2, not illustrated though), and each of the first region 48A and the second region 48B has the ceiling surface 45 higher than the ceiling surface 44. Therefore, volume of the first region 48A and volume of the second region 48B are greater than volume of the separation space HS in the separation region D1 or D2. As will be described below, the processing chamber 1 according to the present embodiment is provided with exhaust ports 61 and 62 for evacuating the first region 48A and the second region 48B, respectively. Because of these exhaust ports 61 and 62, the first region 48A and second region 48B can be made to be maintained at a pressure lower than that in the separation space HS of each of the separation regions D1 and D2. In this case, due to the high pressure of the separation space HS of each of the separation regions D1 and D2, the TMA gas discharged from the raw material gas nozzle 31 in the first region 48A cannot reach the second region 48B via the separation space HS. Similarly, due to the high pressure in the separation space HS of each of the separation regions D1 and D2, $H_2O$ gas or $O_3$ gas discharged from the reactant gas nozzle 32 in the second region 48B cannot reach the first region 48A via the separation space HS. Accordingly, the source gas and the reactant gas are separated by the separation regions D1 and D2, and are almost never mixed in the gas phase in the processing chamber 1.

A height h1 (see FIG. 4A) of the lower ceiling surface 44, from the upper surface of the rotary table 2, is set so that pressure of the separation spaces HS of the separation regions D1 and D2 becomes higher than the pressure of the first regions 48A and the second regions 48B, although the height may depend on the amount of $N_2$ gas supplied from the separation gas nozzle 41 (42). The height h1 is preferably set to, for example, a range between 0.5 mm and 10 mm, more preferably set as low as possible. However, in order to avoid collision of the rotary table 2 with the ceiling surface 44 caused by rotation wobbling of the rotary table 2, it is more preferable that the height h1 is set to a range between 3.5 mm and 6.5 mm within the above-described numerical range. In addition, a height h2 (see FIG. 4A) from the surface of the rotary table 2 to the lower end of the separation gas nozzle 42 (41) contained in the groove portion 43 of the projection 4 may preferably be set to be 0.5 mm to 4 mm for similar reasons to the height h1.

Referring again to FIGS. 1 to 3, the ceiling surface 45 of the ceiling plate 11 is provided with an annular protrusion 5 surrounding the core part 21. The protrusion 5 faces the rotary table 2 in an area outside the core part 21. In the present embodiment, a height h15 of a lower surface of the protrusion 5 from the rotary table 2 is slightly lower than the height h1 of the space HS, as clearly illustrated in FIG. 6. This is because the rotation wobbling near the center of the rotary table 2 is smaller. Specifically, the height h15 may be set to approximately 1.0 mm to 2.0 mm. In other embodiments, heights h15 and h1 may be equal, and the protrusion 5 and the projection 4 may be formed integrally, or may be separate members. FIGS. 2 and 3 illustrate the interior of the processing chamber 1, in which the ceiling plate 11 is removed while the projection 4 remains in the processing chamber 1.

Referring to FIG. 5, which is an enlarged view of an approximately half region of FIG. 1, a separation gas supply tube 51 is connected to a center of the ceiling plate 11 of the processing chamber 1. $N_2$ gas is supplied to a space 52 between the ceiling plate 11 and the core part 21 through the separation gas supply tube 51. Due to the $N_2$ gas supplied to the space 52, a narrow gap 50 between the protrusion 5 and the rotary table 2 can be maintained at a higher pressure than the first region 48A and the second region 48B. Therefore, the TMA gas discharged from the raw material gas nozzle 31 in the first region 48A cannot reach the second region 48B through the gap 50 at the higher pressure. Also, the $H_2O$ gas discharged from the reactant gas nozzle 32 in the second region 48B cannot reach the first region 48A through the gap 50 at the higher pressure. Accordingly, both of the gases are separated by the gap 50, and are almost never mixed in the gas phase in the processing chamber 1. That is, in order to separate the TMA gas from the $H_2O$ gas, the deposition apparatus 300 according to the present embodiment is provided with a center region CT, which is defined by a central portion of the rotary table 2 and the processing chamber 1 and is maintained at a pressure higher than the first region 48A and the second region 48B.

FIG. 6 is a diagram illustrating approximately half of a cross section taken along line II-II of FIG. 3, in which the projection 4 and the protrusion 5 formed integrally with the projection 4 are illustrated. As illustrated, the projection 4 has an L-shaped bent portion 46 at an outer edge of the projection 4. The bent portion 46 almost fills a space between the rotary table 2 and the vessel body 12, which avoids the TMA gas from the raw material gas nozzle 31 and the $H_2O$ gas from the reactant gas nozzle 32 being mixed through this space. A gap between the bent portion 46 and the vessel body 12 and a gap between the bent portion 46 and the rotary table 2 may be set to approximately the same as, for example, the height h1 from the rotary table 2 to the ceiling surface 44 of the projection 4. In addition, because the bent portion 46 is provided, the $N_2$ gas from the separation gas nozzles 41 and 42 (see FIG. 3) is less likely to flow in a direction toward an outside of the rotary table 2. Accordingly, flow of the $N_2$ gas from the isolation regions D1 and D2 to the first region 48A and the second region 48B is encouraged. Further, by providing a blocking member 71b below the bent portion 46, it is possible to further prevent the separation gas from flowing down the rotary table 2. It is preferable that the gap between the bent portion 46 and the rotary table 2 is set so that the size of the gap becomes a size of the above-mentioned space (approximately h1) when the rotary table 2 is heated by a heater unit to be described later, in consideration of thermal expansion of the rotary table 2.

In addition, as illustrated in FIG. 3, in each of the first region 48A and the second region 48B, the inner peripheral wall of the vessel body 12 is recessed outwardly, and an exhaust area 6 is formed therein. At a bottom of each of the exhaust area 6, an exhaust port is provided, for example. In the present embodiment, as illustrated in FIGS. 3 and 5, an exhaust port 61 is provided at the exhaust area 6 corresponding to the first region 48A, and an exhaust port 62 is provided at the exhaust area 6 corresponding to the second region 48B. These exhaust ports 61 and 62 are connected, via exhaust pipes 63, to a vacuum exhaust device such as a common vacuum pump 64 (see FIG. 1). According to this configuration, the first region 48A and the second region 48B are evacuated. Also, as described above, the pressure of the first region 48A and the second region 48B can be made to be lower than the pressure of the separation space HS of the separation regions D1 and D2. In FIG. 3, the exhaust area 6 is provided at a location in which the inner peripheral wall of the vessel body 12 is recessed outwardly, but other configurations may be employed. For example, the exhaust ports 61 and 62 may be provided at the bottom 14 of the processing chamber 1.

Further, as illustrated in FIG. 3, the exhaust port 61 corresponding to the first region 48A is placed at the exhaust area 6 (outside the rotary table 2) and is located below the raw material gas nozzle 31. According to this configuration, the TMA gas discharged from the discharge hole 33 (FIG. 4) of the raw material gas nozzle 31 can flow along the upper surface of the rotary table 2 toward the exhaust port 61 in the longitudinal direction of the raw material gas nozzle 31.

Referring again to FIG. 1, a pressure regulator 65 is provided at the exhaust pipe 63, to adjust pressure in the processing chamber 1. Multiple pressure regulators 65 may be provided each at the corresponding exhaust ports 61 and 62. The exhaust ports 61 and 62 may be provided not only at the bottom of the exhaust area 6 (the bottom 14 of the processing chamber 1), but also at the peripheral wall portion of the vessel body 12 of the processing chamber 1. The exhaust ports 61 and 62 may also be provided at the ceiling plate 11 in the exhaust area 6. However, in a case in which the exhaust ports 61 and 62 are provided at the ceiling plate 11, the gas in the processing chamber 1 flows upward. Thus, because particles in the processing chamber 1 may be flung up, a wafer W may be contaminated. Therefore, the exhaust ports 61 and 62 may preferably be provided at the bottom as illustrated, or may be provided at the peripheral wall portion of the vessel body 12. Also, by providing the exhaust ports 61 and 62 at the bottom, the exhaust pipe 63, the pressure regulator 65, and the vacuum pump 64 can be disposed below the processing chamber 1, thus advantageously reducing the footprint of the deposition apparatus 300.

As illustrated in FIGS. 1, 5 and 6, an annular heater unit 7 serving as a heater is provided between a space between the rotary table 2 and the bottom 14 of the vessel body 12. A wafer W mounted on the rotary table 2 is heated at a predetermined temperature by the heater unit 7. Further, because a blocking member 71a is provided below the rotary table 2 in a vicinity of the outer circumference of the rotary table 2 so as to surround the heater unit 7, a space in which the heater unit 7 is disposed is partitioned from an area outside the heater unit 7. In addition, a slight gap is formed between an upper surface of the blocking member 71a and the lower surface of the rotary table 2. To prevent gas from flowing inward from the blocking member 71a, in a region of the vessel body 12 in which the heater unit 7 is disposed, multiple purge gas supply tubes 73 for supplying gas (purge gas) to purge contents from the region are connected to the bottom of the vessel body 12 at predetermined angular intervals so as to penetrate the bottom of the vessel body 12. In addition, above the heater unit 7, a protective plate 7a protecting the heater unit 7 is supported by the blocking member 71a and a raised portion R to be described below. According to this configuration, even if the TMA gas or the $H_2O$ gas flows into the region in which the heater unit 7 is provided, the heater unit 7 is protected against these gases. The protective plate 7a is preferably made from, for example, quartz.

As illustrated in FIG. 5, the raised portion R is provided on the bottom 14 at a location inside the annular heater unit 7. An upper surface of the raised portion R is positioned close to the rotary table 2 and the core part 21, a small gap is provided between the upper surface of the raised portion R and the lower surface of the rotary table 2 and between the upper surface of the raised portion R and the lower surface of the core part 21. The bottom 14 also has a central hole through which the rotating shaft 22 passes. An inner diameter of the central hole is slightly larger than a diameter of the rotating shaft 22, and a gap in communication with the casing 20 through the flange portion 20a is provided between the bottom 14 and the rotating shaft 22. A purge gas supply tube 72 is connected to an upper portion of the flange portion 20a.

According to this configuration, $N_2$ gas flows from the purge gas supply tube 72 to a space below the rotary table 2 through the gap between the the rotating shaft 22 and the central hole of the bottom 14, the gap between the core part 21 and the raised portion R of the bottom 14, and the gap between the raised portion R of the bottom 14 and the lower surface of the rotary table 2. $N_2$ gas also flows from the purge gas supply tube 73 to the space below the heater unit 7. The $N_2$ gas flows into the exhaust port 61 through the gap between the block member 71a and the lower surface of the rotary table 2. Because the $N_2$ gas flows as described above, the $N_2$ gas serves as a separation gas to prevent TMA gas (or $H_2O$ gas) from flowing through the space below the rotary table 2, and from mixing with $H_2O$ gas (or TMA gas). In addition, the $N_2$ gas serves as a pushing gas for pushing in the TMA gas.

As illustrated in FIGS. 2 and 3, a loading port 15 is formed on the peripheral wall portion of the vessel body 12. Through the loading port 15, the wafer W is conveyed into the processing chamber 1 or is conveyed out of the processing chamber 1 by a conveying arm 10. A gate valve (not illustrated) is provided at the loading port 15, and the loading port 15 is opened and closed by the gate valve. Three through-holes (not illustrated) are formed on a bottom surface of the mounting portion 24, and three lift pins (not illustrated) can be moved up and down through the through-holes. The lift pins support a lower surface of the wafer W to raise and lower the wafer W, and pass the wafer W to and from the conveying arm 10.

As illustrated in FIG. 3, the deposition apparatus 300 according to the embodiment includes a controller 200 for controlling the entire operation of the deposition apparatus 300. The controller 200 includes, for example, a process controller 200a configured by a computer, a user interface unit 200b, and a memory device 200c. The user interface unit 200b includes a display for displaying an operation status of the deposition apparatus, a keyboard or a touch panel (not illustrated) for allowing an operator of the deposition apparatus to select a process recipe or for allowing a process administrator to change parameters of the process recipe.

Also, the controller 200 performs control for executing the film deposition method according to each embodiment, which will be described in detail below. The memory device 200c stores control programs that cause the process controller 200a to perform various processes, process recipes, and parameters in the various processes. Some of these control programs also include steps for performing the deposition method according to each embodiment to be described below, for example. These control programs and process recipes are read out and executed by the process controller 200a according to an instruction from the user interface unit 200b. These control programs may also be stored in a computer readable recording medium 200d, and may be installed into the memory device 200c through a corresponding input/output (I/O) device (not illustrated). The computer readable recording medium 200d may be a hard disk, a CD, a CD-R/RW, a DVD-R/RW, a flexible disk, a semiconductor memory, or the like. These control programs may also be downloaded to the memory device 200c through a communication line.

[Deposition Method According to Embodiments]

Next, examples of deposition methods according to multiple embodiments of the present disclosure will be described with reference to FIGS. 7A to 9C. All of the deposition methods according to the embodiments include a process (which may hereinafter be referred to as a "ramping process") for changing a feed amount per unit time of the raw material gas supplied to the wafer W during a period of deposition. Hereinafter, an entire period of time from a time to start rotating the rotary table 2 to a time to complete the deposition process is referred to as a processing time. Also, a period of time for performing the deposition process in the processing vessel 100, by feeding the raw material gas, the reactant gas, and the purge gas (or pushing gas) after the start of rotating the rotary table 2, is referred to as a deposition time (X (sec)). In addition, a period of time required for the ramping process is referred to as a ramping time (Y (sec)). A ratio (%) of the ramping time (Y) to the deposition time (X) is referred to as a "ramping ratio". Furthermore, in the present specification, "coverage" or "step coverage" has a meaning of step coverage in the normal sense. Further, with respect to a film on a hole (an example of a groove) formed on a multilayer film, "coverage" or the like refers to a ratio (%) of a film thickness at a given depth position (in FIG. 7B, a film thickness at a lower end (which is an example of the depth position) of a hole, is t3) to a film thickness at the top of the hole (t2 in FIG. 7B).

Hereinafter, the deposition methods according to a first to fourth embodiments are common in that a raw material gas supply rate (a feed amount per unit time of a raw material gas) is maximized at a deposition start time T0 and the raw material gas supply rate is reduced over time. In contrast, the deposition methods according to a fifth to seventh embodiments are common in that the raw material gas supply rate is minimized at the deposition start time T0 and the raw material gas supply rate is increased over time.

<Deposition Method According to First Embodiment>

Figure 7A:
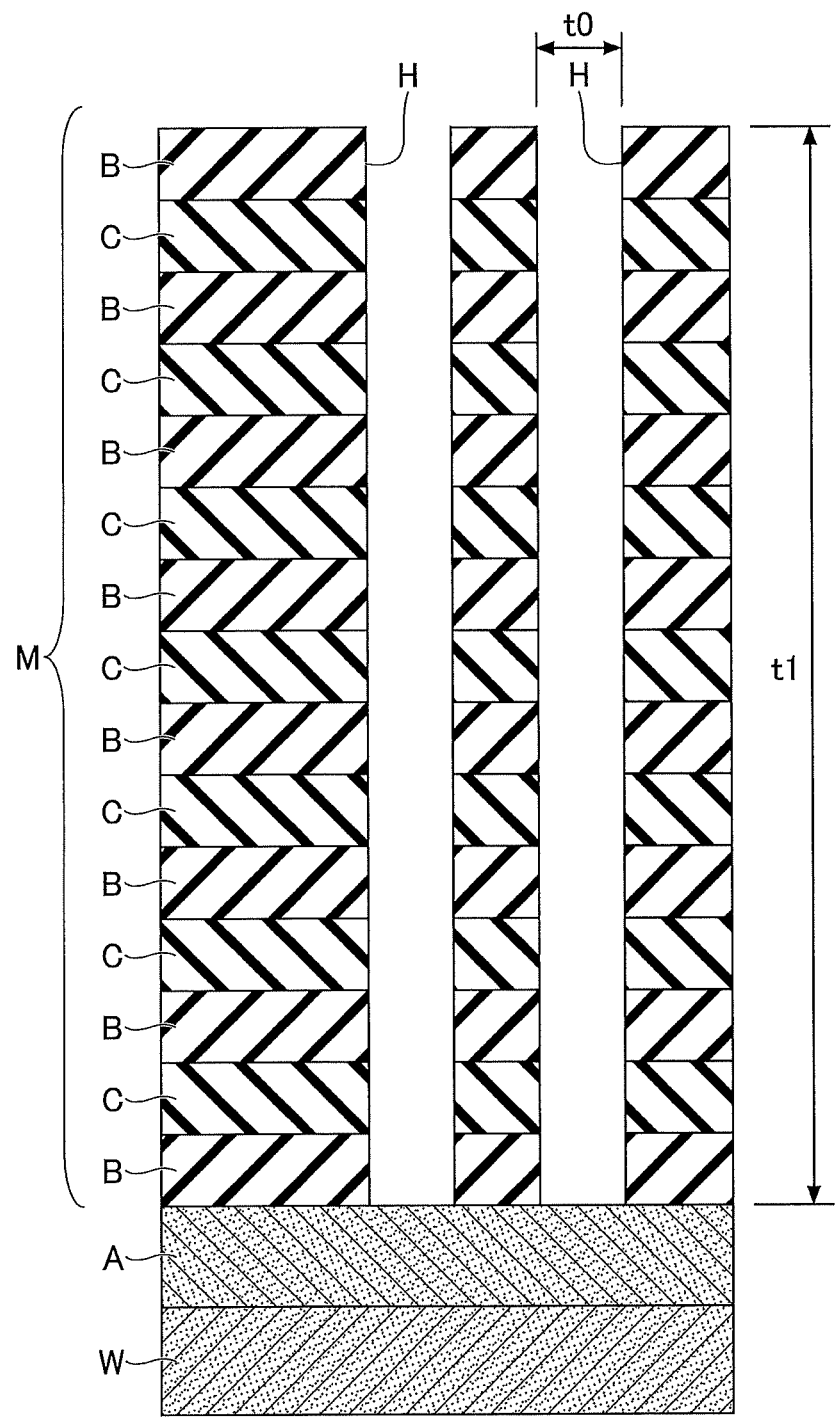
FIG. 7A illustrates an example of a multilayer film having a groove that is to be deposited, which is formed on a wafer.

An example of the deposition method according to the first embodiment will be described with reference to FIG. 8A. First, a substrate W applied to the deposition method according to each of the embodiments will be described with reference to FIG. 7A. As illustrated in FIG. 7A, a film A, which is a silicon (Si) film, is formed on a surface of the substrate W, and a multilayer film M, which is formed by an insulating film B formed of a silicon oxide film ($SiO_2$ film) and an electrode film C formed of a polysilicon (Poly-Si) film being laminated sequentially, is formed on the surface of the film A. An example of the wafer W is a wafer for 3D (three-dimensional) NAND-type flash memory.

In the multilayer film M, a deep hole H is pre-formed by an etching process (the hole H is an example of a groove (deep groove). Alternatively, a trench may be pre-formed). The inner diameter of the hole H is to, a thickness of the multilayer film M is t1, and an aspect ratio (t1/t0) is 40 or larger. For example, t1 can be set to 7 μm or larger, and t0 can be set to approximately 150 nm to 200 nm.

The deposition method according to the present embodiment will be described, by exemplifying a case in which a protective film is formed on a wall surface of the hole H of a multilayer film M having such a high aspect ratio and a multilayer structure formed by layering different types of films alternately.

Figure 7B:
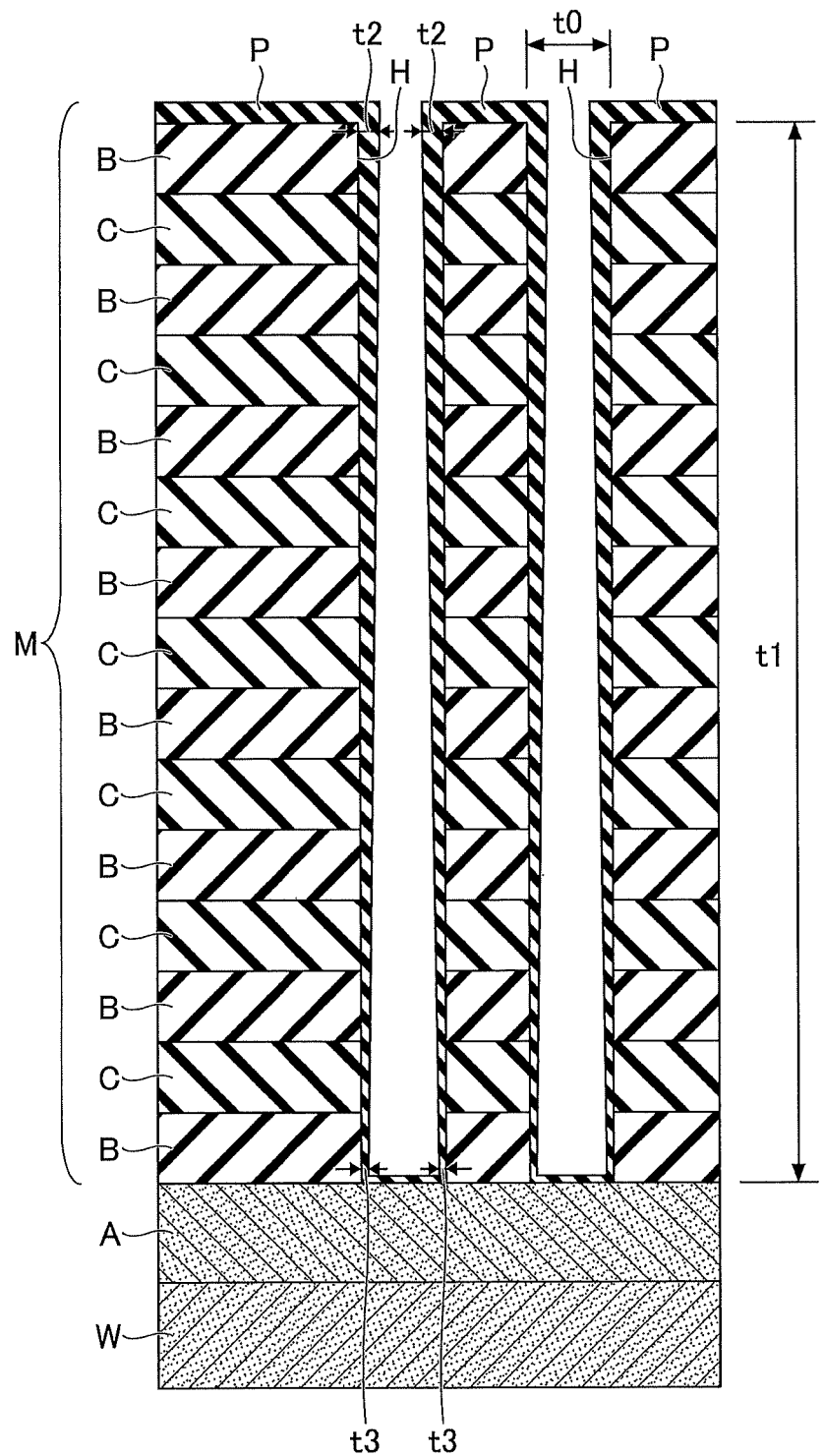
FIG. 7B is a view illustrating a state in which a protective film is formed on the wall surface of the groove of the multilayer film, with a thickness of the protective film adjusted in a depth direction of the groove.

As illustrated in FIG. 7B, in the deposition method according to the present embodiment, a protective film P is formed on the wall surface of the hole H such that a thickness of the protective film P gradually (preferably in a linear manner) decreases from a top end of the multilayer film M toward a lower end. In FIG. 7B, the thickness of the protective film P at the top end is t2, the thickness at the lower end is t3, and the thickness of the protective film P on the bottom of the hole H is t3. With respect to the protective film P, a ratio of the film thickness t3 at the lower end to the film thickness t2 at the top can be set variously, such as a range from 20% to 70%, for example.

For example, as illustrated, after forming the protective film P whose thickness gradually decreases from the top of hole H toward the lower end, anisotropic etching is performed to etch the film A, which is a silicon (Si) film, while protecting the wall surface of the hole H with the protective film P. By performing this anisotropic etching, the hole H maintaining an inner diameter to, from the top of the multilayer film M to the surface of the wafer W, can be formed. In this case, because the protective film P is thinly formed at the bottom of hole H, an etching rate of the film A below hole H becomes higher when performing the anisotropic etching. In addition, because the etching gas is supplied from above the hole H, the protective film P at a location closer to the top of the hole H is easily etched, and the protective film P is less likely to be etched toward the lower end of the hole H. However, because the protective film P as illustrated is formed in a manner in which the protective film P is the thickest at the top of the hole and in which the thickness of the protective film P decreases gradually toward the lower end of the hole H, isotropic etching of the hole H can be prevented.

Figure 8A:
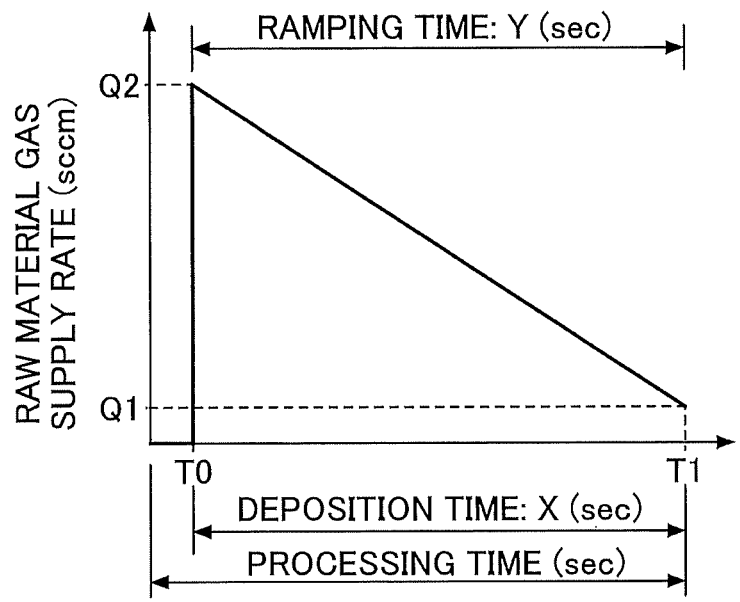
FIG. 8A is a diagram illustrating an example of a process sequence of a deposition method according to a first embodiment.

As illustrated in FIG. 8A, in the deposition method according to the present embodiment, at deposition start time T0, a raw material gas supply rate (amount of raw material gas supplied per unit time) is raised to a maximum rate Q2 (sccm: standard cc/min) immediately. Next, the deposition process is performed while adjusting the raw material gas supply rate in a manner in which the raw material gas supply rate decreases in accordance with a linear function (at a constant rate) such that the raw material gas supply rate reaches a minimum rate Q1 at end time T1 of the deposition process. Thus, the ramping ratio ((Y/X)×100) is 100%. In the following description, with respect to the raw material gas, a case for using TMA gas will be described. However, an aminosilane gas such as DIPAS gas, 3DMAS gas, and BTBAS gas may be used as the raw material gas. In addition, by using TMA gas as the raw material gas and by reacting the TMA gas with a reactant gas, which is an oxidant gas such as water vapor ($H_2O$), a protective film P formed of an aluminum oxide film (AlO film) is formed (see FIG. 7B). Because the aluminum oxide film has a high selective ratio in dry etching, and is excellent in removability when a cleaning process is performed after dry etching, it is possible to form a protective film that can contribute to a high throughput. Although a graph in FIG. 8A is illustrated as if the raw material gas supply rate reaches without time from zero to the maximum rate Q2, the first embodiment (FIG. 8A) includes a case in which it takes a slight amount of time to reach the maximum rate Q2.

Because the TMA gas, which is the raw material gas, is supplied from above the hole H formed in the multilayer film M, a film is gradually formed from an upper end to a lower end of the wall surface of the hole H. The thickness of the protective film P tends to decrease gradually from the upper end to the lower end where a supply amount of the raw material gas is relatively high. However, in a case in which a film is formed while the raw material gas supply rate is constant (without performing the ramping process), it is difficult to form the protective film P as illustrated in FIG. 7B, which is formed, for example, in a manner in which the thickness of the film varies linearly. For example, if the raw material gas supply rate is set to large, a protective film having a large film thickness tends to be formed at the bottom of the hole H. Thus, when the layer A is etched by the etching process after forming the protective film, the protective film may inhibit the etching of layer A. Conversely, if the raw material gas supply rate is set to small, the raw material gas is less likely to be supplied to a lower end side of the hole H, and it becomes difficult to form the protective film P for preventing isotropic etching on the wall surface at the lower end side of the hole H.

By performing the ramping process illustrated in FIG. 8A, a continuous protective film P whose film thickness changes gradually from the top end of the hole H to the lower end can be formed, while forming a protective film on the bottom of the hole H as thin as possible.

The maximum rate Q2 may define thickness t3 of the protective film P at the lower end of the wall surface of the hole H and on the bottom of the hole H. Also, the deposition time may define the thickness t2 of the protective film P at the top end of the wall surface of the hole H. By adjusting a gradient of the ramping process, or the ramping ratio (100% in the present embodiment), it is possible to form a protective film P having desired step coverage whose film thickness is adjusted linearly.

<Deposition Method According to Second Embodiment>

Figure 8B:
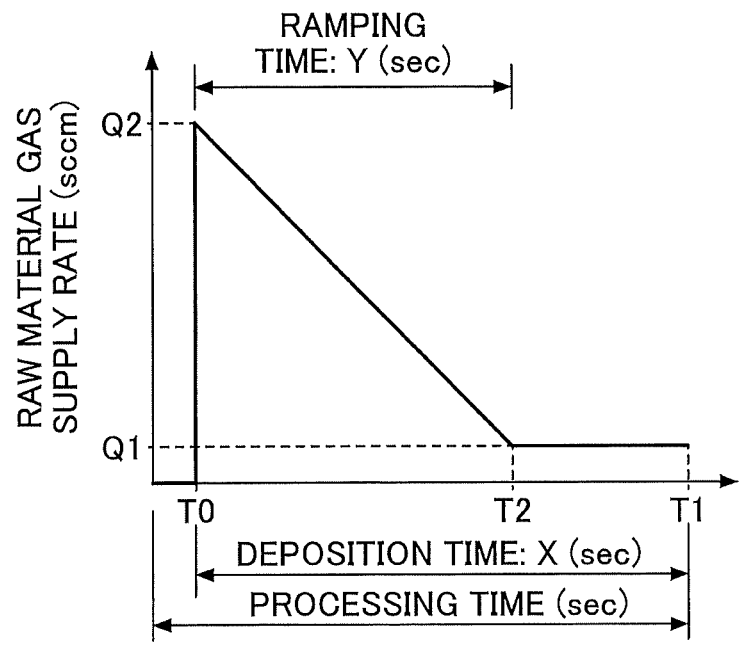
FIG. 8B is a diagram illustrating an example of a process sequence of a deposition method according to a second embodiment.

An example of the deposition method according to the second embodiment will be described with reference to FIG. 8B. As illustrated in FIG. 8B, in the film deposition method according to the present embodiment, after the raw material gas supply rate is raised to the maximum rate Q2 immediately when the deposition process is started at deposition start time T0, the raw material gas supply rate is reduced in accordance with a linear function such that the raw material gas supply rate reaches the minimum rate Q1 at time T2 prior to the end time T1. Then, from time T2 to the end time T1, the film forming process is performed while maintaining the raw material gas supply rate at the minimum rate Q1. Although the ramping ratio ((Y/X)×100) varies depending on the set time of T2, adjustment is possible, for example, in the range of approximately 30% to 90%.

<Deposition Method According to Third Embodiment>

Figure 8C:
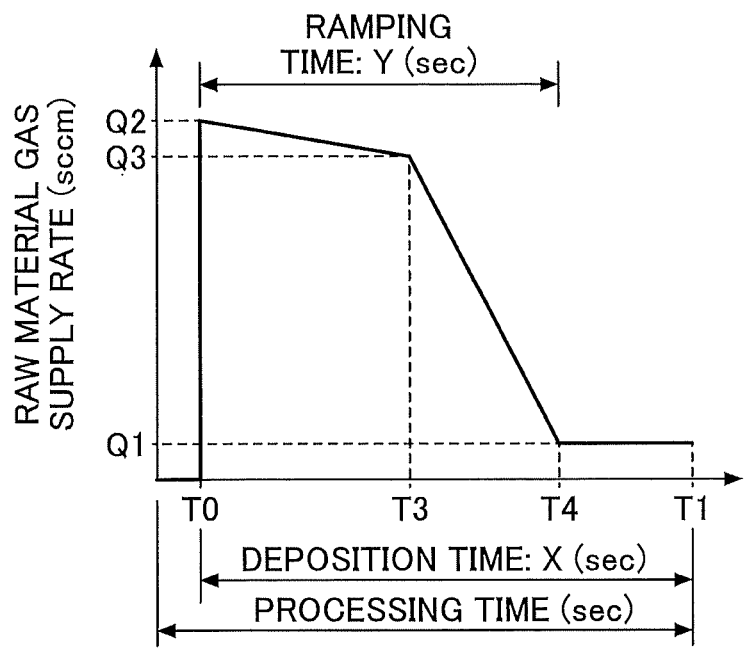
FIG. 8C is a diagram illustrating an example of a process sequence of a deposition method according to a third embodiment.

An example of the deposition method according to the third embodiment will be described with reference to FIG. 8C. As illustrated in FIG. 8C, in the film deposition method according to the present embodiment, after the raw material gas supply rate is raised to the maximum rate Q2 immediately when the deposition process is started at deposition start time T0, the raw material gas supply rate is reduced in accordance with a linear function such that the raw material gas supply rate reaches a rate Q3 (which is between the maximum rate Q2 and the minimum rate Q1) at time T3 prior to the end time T1. Next, from time T3 to time T4 prior to the end time T1, the raw material gas supply rate is reduced in accordance with a linear function such that the raw material gas supply rate reaches the minimum rate Q1 at time T4. Then, from time T4 to the end time T1, the film forming process is performed while maintaining the raw material gas supply rate at the minimum rate Q1. As described above, the deposition method according to the present embodiment is a method of performing a ramping process, in which a reduction rate of the raw material gas supply rate changes in the middle. Note that although the illustrated method is a deposition method including two ramping processes each having a different reduction rate of the raw material gas supply rate, a deposition method may include more than two ramping processes each having a different reduction rate of the raw material gas supply rate.

<Deposition Method According to Fourth Embodiment>

Figure 8D:
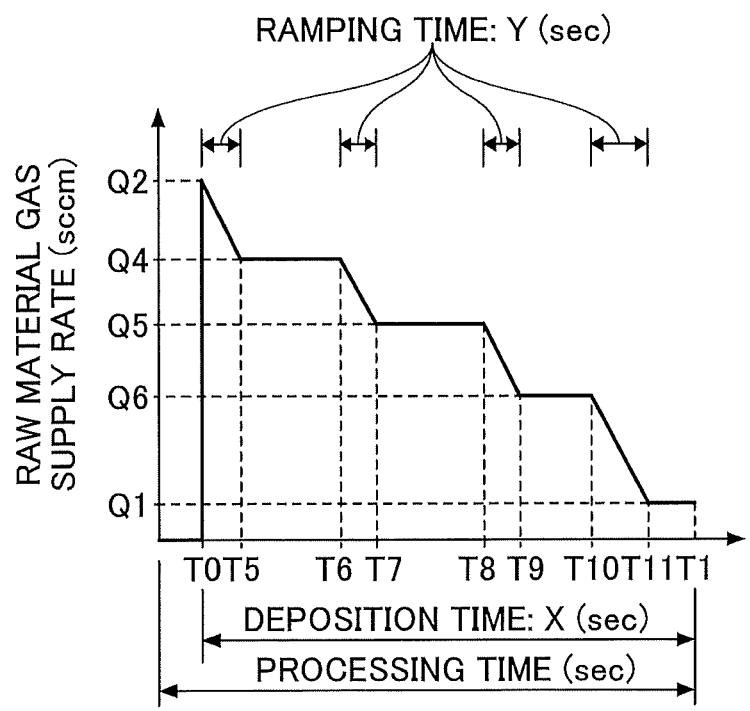
FIG. 8D is a diagram illustrating an example of a process sequence of a deposition method according to a fourth embodiment.

An example of the deposition method according to the fourth embodiment will be described with reference to FIG. 8D. As illustrated in FIG. 8D, in the deposition method according to the present embodiment, after the raw material gas supply rate is raised to the maximum rate Q2 immediately when the deposition process is started at deposition start time T0, the raw material gas supply rate is reduced in accordance with a linear function such that the raw material gas supply rate reaches a rate Q4 at time T5 prior to the end time T1, and the raw material gas supply rate is maintained at Q4 from time T5 to time T6. Next, the raw material gas supply rate is reduced in accordance with a linear function such that the raw material gas supply rate reaches a rate Q5 at time T7, and the raw material gas supply rate is maintained at Q5 from time T7 to time T8. Next, the raw material gas supply rate is reduced in accordance with a linear function such that the raw material gas supply rate reaches a rate Q6 at time T9, and the raw material gas supply rate is maintained at Q6 from time T9 to time T10. Further, the raw material gas supply rate is reduced in accordance with a linear function such that the raw material gas supply rate reaches the minimum rate Q1 at time T11, and the raw material gas supply rate is maintained at Q1 from time T11 to the end time T1.

As described above, the deposition method according to the present embodiment is a method of executing multiple sequence processes, each of which is a set of a process of gradually decreasing the raw material gas supply rate and a process of maintaining the raw material gas supply rate at a constant rate (FIG. 8D illustrates a case in which four sequence processes are executed). Note that a reduction rate of the raw material gas supply rate may be the same in each of the sequence processes, or may be different in each of the sequence processes. Alternatively, a reduction rate of the raw material gas supply rate may be the same in some (at least two) of the multiple sequence processes. Also, the ramping time is a sum of periods during which the raw material gas supply rate gradually decreases.

<Deposition Method According to Fifth Embodiment>

Figure 9A:
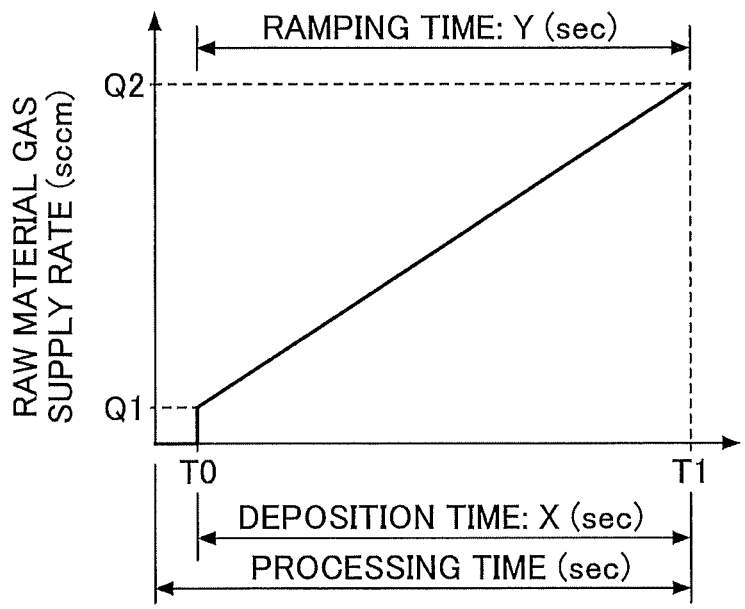
FIG. 9A is a diagram illustrating an example of a process sequence of a deposition method according to a fifth embodiment.

An example of the deposition method according to the fifth embodiment will be described with reference to FIG. 9A. As illustrated in FIG. 9A, in the deposition method according to the present embodiment, the deposition process is performed by adjusting the raw material gas supply rate in a manner in which the raw material gas supply rate is set to the minimum rate Q1 at the deposition start time T0, and in which the raw material gas supply rate is increased in accordance with a linear function such that the raw material gas supply rate reaches the maximum rate Q2 at the end time T1 of the deposition process. Thus, similar to the deposition method according to the first embodiment, the ramping ratio ((Y/X)×100) is 100%.

<Deposition Method According to Sixth Embodiment>

Figure 9B:
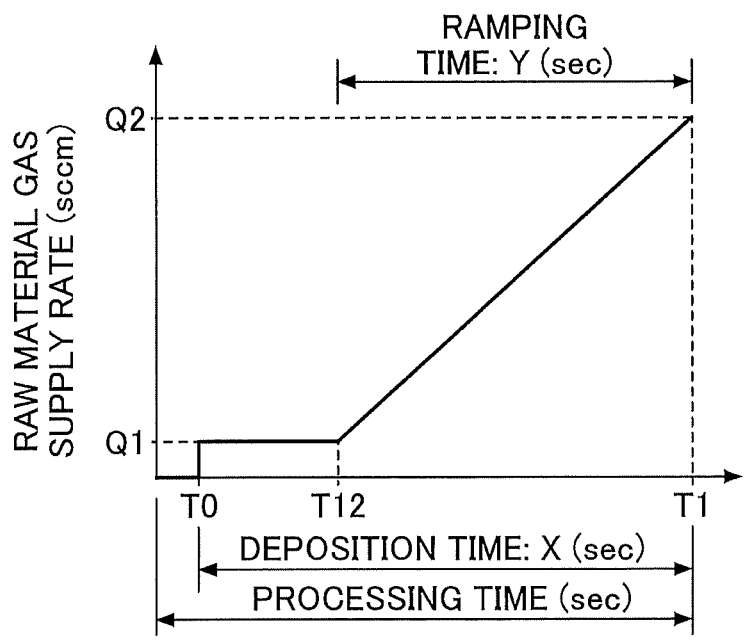
FIG. 9B is a diagram illustrating an example of a process sequence of a deposition method according to a sixth embodiment.

An example of the deposition method according to the sixth embodiment will be described with reference to FIG. 9B. As illustrated in FIG. 9B, in the deposition method according to the present embodiment, the deposition process is executed by adjusting the raw material gas supply rate in a manner in which the raw material gas supply rate is maintained at the minimum rate Q1 from the deposition start time T0 to time T12, and in which the raw material gas supply rate is increased in accordance with a linear function from time T12 to the end time T1 such that the raw material gas supply rate reaches the maximum rate Q2 at the end time T1. The ramping ratio ((Y/X)×100) varies with the set time of T12, but adjustment is possible, for example, in the range of approximately 30% to 90%.

<Deposition Method According to Seventh Embodiment>

Figure 9C:
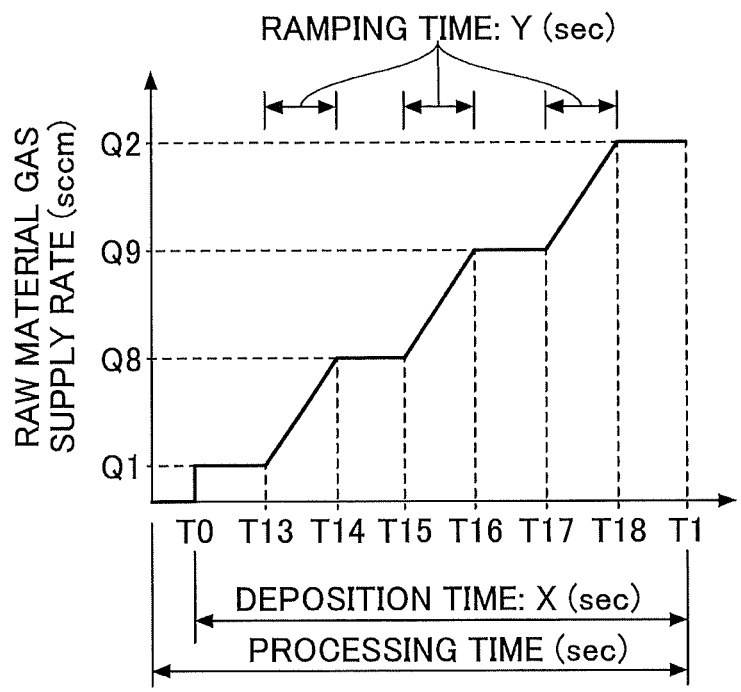
FIG. 9C is a diagram illustrating an example of a process sequence of a deposition method according to a seventh embodiment.

An example of the deposition method according to the seventh embodiment will be described with reference to FIG. 9C. As illustrated in FIG. 9C, in the deposition method according to the present embodiment, the raw material gas supply rate is maintained at the minimum rate Q1 from the deposition start time T0 to time T13, and the raw material gas supply rate is increased in accordance with a linear function such that the raw material gas supply rate reaches a rate Q8 at time T14. Next, the raw material gas supply rate is maintained at Q8 from time T14 to time T15, and the raw material gas supply rate is increased in accordance with a linear function such that the raw material gas supply rate reaches a rate Q9 at time T16. Next, the raw material gas supply rate is maintained at Q9 from time T16 to time T17, and the raw material gas supply rate is increased in accordance with a linear function such that the raw material gas supply rate reaches the maximum rate Q2 at time T18. Thereafter, the raw material gas supply rate is maintained at Q2 from time T18 to the end time T1 of the deposition process.

As described above, the deposition method according to the present embodiment is a method of executing multiple sequence processes, each of which is a set of a process of maintaining the raw material gas supply rate at a constant rate and a process of gradually increasing the raw material gas supply rate (FIG. 9C illustrates a case in which three sequence processes are executed).

<Deposition Method According to Eighth Embodiment>

Figure 10:
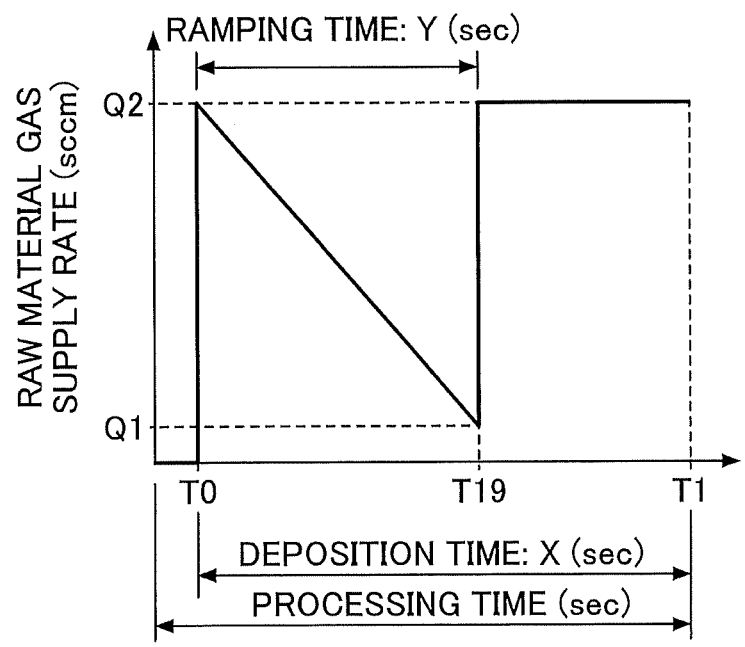
FIG. 10 is a diagram illustrating an example of a process sequence of a deposition method according to an eighth embodiment.

An example of the deposition method according to the eighth embodiment will be described with reference to FIG. 10. As illustrated in FIG. 10, in the film deposition method according to the present embodiment, the deposition process is executed by adjusting the raw material gas supply rate in the following manner. First, after the raw material gas supply rate is immediately raised to the maximum rate Q2 at deposition start time T0, the raw material gas supply rate is reduced in accordance with a linear function such that the raw material gas supply rate reaches the minimum rate Q1 at time T19 prior to the end time T1. Next, after the raw material gas supply rate is again raised to the maximum rate Q2 immediately at time T19, the raw material gas supply rate is maintained at Q2 until the end time T1 of the deposition process. As described above, the deposition method according to the present embodiment is a method of adjusting the raw material gas supply rate in a manner in which the raw material gas supply rate is increased, decreased, and again increased.

[Experiments to Confirm Dependency of Step Coverage of Film Against Ramping Ratio at Deposition]

The inventors have conducted experiments to confirm dependency of step coverage of a film against a ramping ratio when depositing the film. In conjunction with this experiment, an experiment to observe dependency of step coverage of a film against rotational speed of a susceptor, and an experiment to observe dependency of step coverage of a film against a flow rate of the raw material gas, have been performed.

<Outline of Experiments>

In every experiment, a temperature of the susceptor was set to 350° C., a pressure in the processing vessel was set to 2 Torr (266 Pa), TMA gas was used as the raw material gas, and $H_2O$ gas was used as the reactant gas. Also, $N_2$ gas was used as a purge gas (which also serves as a pushing gas). $H_2O$ gas was supplied constantly at a rate of 1000 sccm, and $N_2$ gas was supplied constantly at a rate of 8500 sccm.

A multilayer film with a hole was formed on a surface of a wafer. A height (depth) of the hole was 7.5 μm, a diameter of the top of the hole was 175 nm, and a diameter of the bottom of the hole was 75 nm.

An experiment to observe dependency of step coverage of a film against rotational speed of a susceptor will be referred to as Experiment 1. In Experiment 1, step coverage at each hole depth position was measured when the susceptor was rotated at five types of speeds: 15 RPM, 60 RPM, 120 RPM, 200 RPM, and 240 RPM. As described above, coverage at each depth position is a ratio (%) of a film thickness at each depth position of the hole to a film thickness at the top end of the hole.

An experiment to observe dependency of step coverage of a film against a flow rate of the raw material gas will be referred to as Experiment 2. In Experiment 2, step coverage at each hole depth position was measured when the raw material gas was supplied at four types of flow rates, 50 sccm, 100 sccm, 200 sccm, and 300 sccm. The flow rate of each case was constant.

Further, an experiment to confirm dependency of step coverage of a film against a ramping ratio will be referred to as Experiment 3. In Experiment 3, the deposition method according to the process sequence illustrated in FIG. 8B was applied to measure step coverage at each hole depth position when the ramping ratio was 30%, 60%, and 90%.

<Experimental Results>

Figure 11:
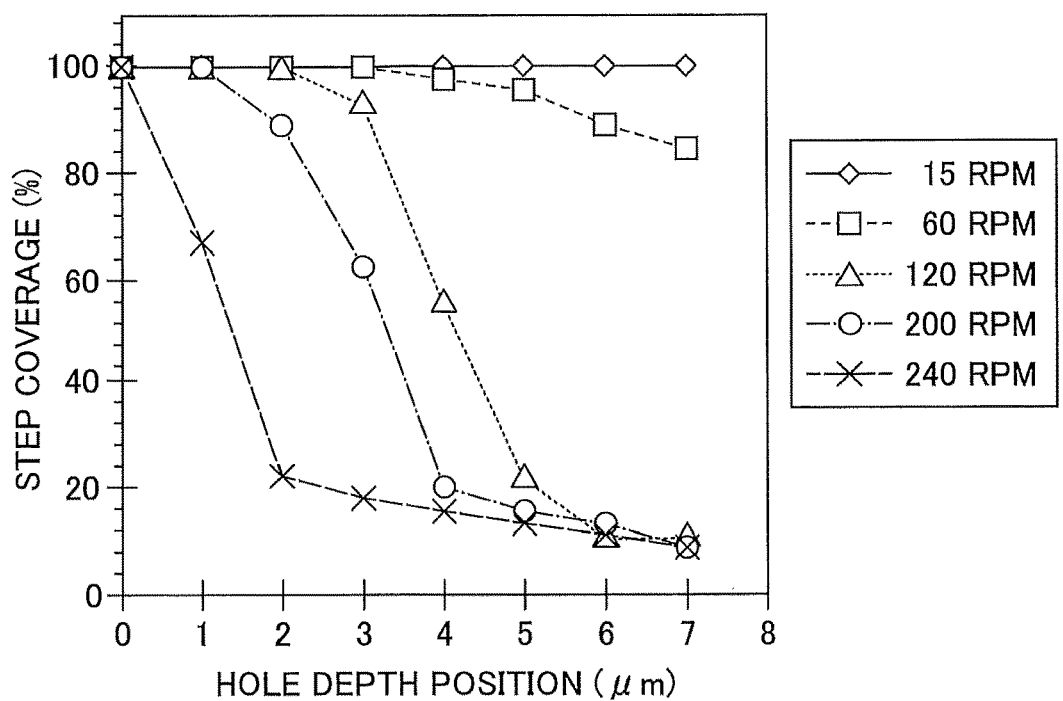
FIG. 11 is a diagram illustrating a result of an experiment confirming a susceptor rotational speed dependency of step coverage of a film.
Figure 12:
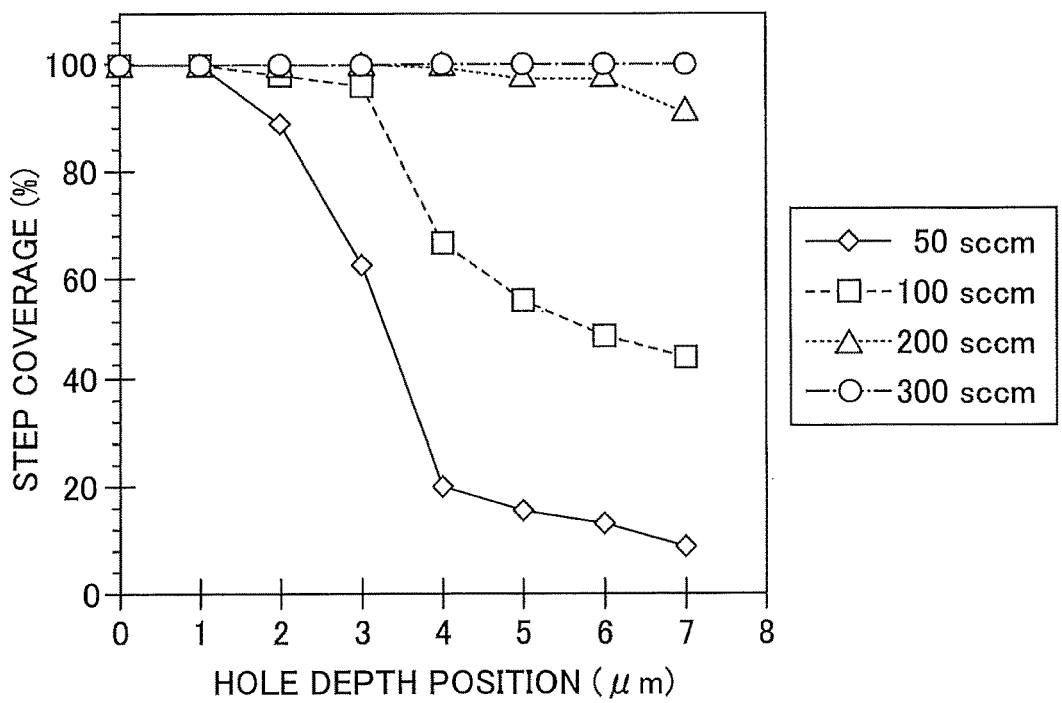
FIG. 12 is a diagram illustrating a result of an experiment confirming raw material gas flow rate dependency of the step coverage of the film.
Figure 13:
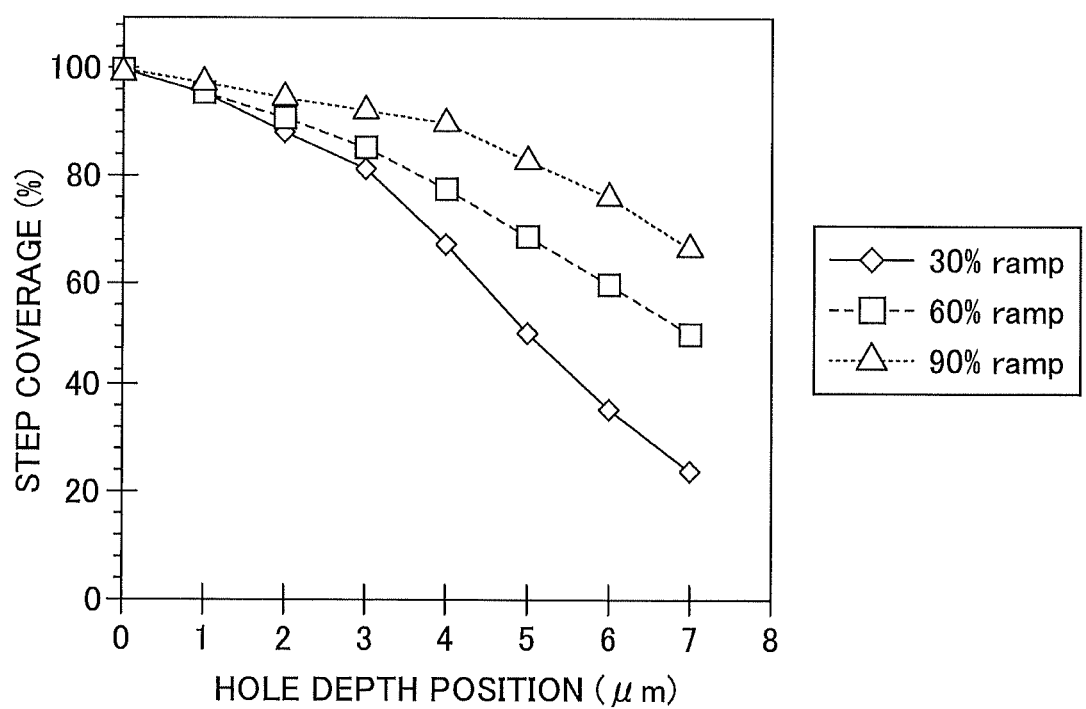
FIG. 13 is a diagram illustrating a result of an experiment confirming that the step coverage of the film depends on a ramping ratio during deposition.

FIGS. 11, 12, and 13 illustrate the results of Experiments 1, 2, and 3 respectively. First, from FIG. 11, it was proved that coverage at the bottom of the hole became 80% or more and that a protective film at the bottom of the hole cannot be thinly formed in case of slow rotational speed of 60 RPM or less. In contrast, when the rotational speed was high, 120 RPM or higher, the protective film at the bottom of the hole could be thinly formed. However, it was proved that the coverage tended to drop drastically toward the middle depth of the hole and to remain unchanged at a depth below the middle depth of the hole. This means that the thickness of the protective film on the wall surface of the hole cannot be controlled linearly from the top end to the lower end of the hole on the wall surface of the hole.

In addition, from FIG. 12, it was proved that, when the raw material gas was supplied at a constant rate of 200 sccm or higher, coverage at the bottom of the hole has become 90% or higher, and that the protective film at the bottom of the hole could not be thinly formed. In contrast, when the raw material gas was supplied at a constant rate of 100 sccm or less, the protective film at the bottom of the hole could be formed into a thin film. However, it has been proved that the coverage tended to drop drastically toward the middle depth of the hole and that the coverage tends to remain unchanged at a depth below the middle of the hole. This means that, similar to FIG. 11, the thickness of the protective film on the wall surface of the hole cannot be controlled linearly from the top end to the lower end of the hole.

On the other hand, from FIG. 13, if the ramping ratio is set to 30%, 60%, or 90%, it was proved that the protective film at the bottom of the hole can be thinly formed at any ramping ratios of 30%, 60%, and 90%, and that the thickness of the protective film can be controlled as linearly as possible from the top end to the lower end of the hole.

Also, from FIG. 13, it can be seen that required coverage (step coverage) can be realized by adjusting the ramping ratio.

Further, it can be seen that, in a case in which the film thickness at the bottom of the hole is desired to be as thin as possible, the ramping ratio is preferably controlled to be low.

Other embodiments, such as an embodiment with which other components are combined with the configurations described in the aforementioned embodiments, may be employed. Further, the present invention is not limited to the configurations described in the aforementioned embodiments. In this respect, changes may be made to the extent that they do not depart from the scope of the present disclosure, and may be adequately defined in accordance with the form of application thereof.

What is claimed is:

1. A method of depositing a film over a substrate covered with at least a multilayer film provided with a groove, the method comprising:
    forming the multilayer film on the substrate by laminating an insulating film formed of a silicon oxide film and an electrode film formed of a polysilicon film alternately,
    performing an etching process so as to form the groove in the multilayer film,
    performing a deposition process for depositing the film on the multilayer film provided on the substrate by supplying at least a raw material gas, the deposition process being performed while gradually decreasing an amount of the raw material gas supplied per unit time without simultaneously performing the etching process, and
    controlling a thickness of the film to be deposited on a wall surface of the groove linearly and gradually decreases from a top end of the wall surface toward a lower end of the wall surface and a ratio of the thickness of the film at the lower end to the thickness of the film at the top is in a range from 20% to 70%,
    wherein a ratio of a ramping time Y to a deposition time X is in a range from 30% to 90%,
    wherein the deposition time X (sec) is defined as an entire period of time of the deposition process and the ramping time Y (sec) is defined as an entire period of time of changing the amount of the raw material gas supplied per unit time, and
    wherein the method further comprises:
    supplying, from a raw material gas nozzle, the raw material gas in a supply region that is arranged between two separation regions, and
    evacuating the supply region from an exhaust port that is provided in a concave portion of an inner wall of a processing chamber, said concave portion being curved outwardly in a radial direction of a rotary table, said evacuation port being provided downstream side relative to the raw material gas nozzle.

2. The method according to claim 1, wherein the changing of the amount of the raw material gas supplied per unit time includes
    setting the amount of the raw material gas supplied per unit time to a maximum value; and
    gradually decreasing the amount of the raw material gas supplied per unit time at a constant rate, after the amount of the raw material gas supplied per unit time is set to the maximum value.

3. The method according to claim 1, the deposition process being performed by using a deposition apparatus, the deposition apparatus including
    a processing vessel accommodating a rotary table in a rotatable manner, the rotary table including a mounting portion on an upper surface, the mounting portion being configured to mount a plurality of substrates, each of the plurality of substrates being the substrate; and
    a processing region including a gas supply part configured to supply the raw material gas to the upper surface of the rotary table; wherein
        the method further includes mounting the substrate on each of the mounting portions; and the supplying of at least the raw material gas is performed while rotating the rotary table.

4. The method according to claim 1, wherein the groove is a hole or trench.

5. The method according to claim 2, wherein the deposition process is performed such that a thickness of the film to be deposited on a wall surface of the groove gradually decreases from a top end of the wall surface toward a lower end of the wall surface.

6. The method according to claim 1, wherein the processing chamber has a ceiling plate that has a protrusion that protrudes toward the rotary table for each of the two separation regions so that a ceiling surface of the protrusion has a height hl from the rotary table,
 wherein the protrusion has an L-shaped bent portion at an outer edge of the projection, said L-shaped bent portion being formed by the outer edge of the projection further protruding toward the rotary table, and
 wherein a gap between the L-shaped bent portion and an outer peripheral surface of the rotary table that faces in a radial direction of the rotary table is approximately the same as the height hl.

* * * * *